(12) United States Patent
Popovic et al.

(10) Patent No.: US 6,376,321 B1
(45) Date of Patent: Apr. 23, 2002

(54) METHOD OF MAKING A PN-JUNCTION IN A SEMICONDUCTOR ELEMENT

(75) Inventors: Radivoje Popovic, Zug; Alexandre Pauchard, Progens; Alexis Rochas, Lausanne, all of (CH)

(73) Assignee: Sentron AG, Zug (CH)

( * ) Notice: Subject to any disclaimer, the term of this patent is extended or adjusted under 35 U.S.C. 154(b) by 0 days.

(21) Appl. No.: 09/690,218

(22) Filed: Oct. 17, 2000

Related U.S. Application Data

(63) Continuation-in-part of application No. 09/494,316, filed on Jan. 18, 2000.
(60) Provisional application No. 60/234,077, filed on Sep. 20, 2000.

(51) Int. Cl.$^7$ ............................................. H01L 21/22
(52) U.S. Cl. ..................................... 438/305; 438/299
(58) Field of Search .................................. 438/305, 299

(56) References Cited

U.S. PATENT DOCUMENTS

| | | |
|---|---|---|
| 3,735,210 A | 5/1973 | Kalish et al. |
| 4,127,859 A | 11/1978 | Nelson |
| 4,683,483 A | 7/1987 | Burnham et al. |
| 4,999,309 A * | 3/1991 | Buynoski .................... 438/530 |
| 5,298,788 A | 3/1994 | Moreau |

FOREIGN PATENT DOCUMENTS

| | | |
|---|---|---|
| DE | 43 29 837 A1 | 3/1995 |
| EP | 0 296 371 A1 | 12/1988 |
| EP | 0 948 038 A1 | 10/1999 |
| JP | 57-122579 A | 7/1982 |

* cited by examiner

*Primary Examiner*—Richard Elms
*Assistant Examiner*—Beth E. Owens
(74) *Attorney, Agent, or Firm*—McCormick, Paulding & Huber LLP

(57) ABSTRACT

A pn-junction in a semiconductor element is made in that, within a zone of a first conductivity type, by means of implantation, a first and second zone of a second conductivity type are formed which are initially separated from each other, with subsequent diffusion processes, as a result of lateral diffusion, the first and second zones combine into a connected well, by means of implantation, a further zone of the first conductivity type is formed which completely overlaps the first zone of the second conductivity type and which is larger than the first zone, and which does not touch the second zone of the second conductivity type.

4 Claims, 2 Drawing Sheets

METHOD OF MAKING A PN-JUNCTION IN A SEMICONDUCTOR ELEMENT

CROSS REFERENCE TO RELATED APPLICATIONS

This application is a continuation-in-part of U.S. application Ser. No. 09/494,316, filed Jan. 28, 2000 and entitled "Method of Making Hall-Effect Devices," and which is herein incorporated by reference, and this application claims priority to U.S. provisional patent application Ser. No. 60/234,077, which was filed on Sep. 20, 2000 and which is herein incorporated by reference.

BACKGROUND OF THE INVENTION

The invention concerns a method of making a pn-junction in a semiconductor element.

Semiconductor elements have numerous pn-junctions. Apart from anything else, such pn-junctions have found a multitude of applications as photosensors.

Various types of photosensors are used for the monitoring of burners. Over the last twenty years, conventional yellow light burners have been increasingly replaced by blue light burners. The ultraviolet spectral range is best suited for optical detection of the presence or absence of the flame as the infrared radiation coming from the burner itself must not lead to display of a "flame present" signal. A silicon-based semiconductor diode which is suitable for the monitoring of blue light burners is known from the U.S. Pat. No. 4,910,570. With certain types of burners however, the light given out by the flame is too small to be detected by this semiconductor diode. Therefore, photoelectric multipliers or gaseous discharge tubes are still used for these burners. These photosensors are large, expensive, sensitive to magnetic fields, can be easily damaged and require high voltage for operation.

To a large extent, electronic cameras use image sensors which are based on the CCD (charge-coupled device) technology. In the low-cost range, image sensors based on the CMOS technology with which each pixel contains a photodiode, a pre-amplifier and read-out electronics are increasingly used. Such CMOS image sensors are indeed cheaper, but less sensitive than CCD image sensors.

From the articles "CMOS compatible avalanche photodiode", Proceedings of the SPIE, 3410 (1998), pages 10–20, herein incorporated by reference, and "Avalanche photodiode array in BiCMOS technology" Proceedings of the SPIE, 3649 (1999) pages 40–49 from A. Biber and P. Seitz, herein incorporated by reference, avalanche photodiodes are known which can be produced on the same chip as the electronics. According to the dissertation from W. J. Kindt with the title "Geiger mode avalanche photodiode arrays for spatially resolved single photon counting", Delft University Press, 1999, Chapters 3 to 6, herein incorporated by reference, such avalanche photodiodes can be operated in Geiger mode and enable the detection of single photons. According to the dissertation from A. Biber with the title "Avalanche Photodiode Image Sensing in Standard Silicon BiCMOS Technology", Diss ETH No. 13544, Chapter 5, herein incorporated by reference, they can also be used as image sensors. An avalanche photodiode which is sensitive to the ultraviolet spectral range is known from A. Pauchard's dissertation with the title "Silicon Sensor Microsystem for Ultraviolet Detection", Hartung-Gorre Series in Microsystems Volume 7 (2000), Chapters 4 and 5, herein incorporated by reference. However, these known avalanche photodiodes require special process stages and, in addition, have too high leakage currents.

SUMMARY OF THE INVENTION

An object of the invention is to develop semiconductor photosensors with improved characteristics so that they are suitable for flame monitoring and/or for use in electronic cameras.

The description of the invention is based on the expressions commonly used in the production of semiconductor elements. Additionally, the description is restricted to the explanation of the fundamental characteristics of the invention.

FIG. 1 shows a cross-section of a diode realized with CMOS technology which is embedded in a p-doped substrate 1. The diode consists of a p-doped well 2 which is completely located within an n-doped well 3. According to the invention, it is understood that the breakdown voltage of the pn-junction formed between the two wells 2 and 3 is limited by breakdowns along the lateral edge 4 of the pn-junction. The reason for this is that the concentration of ions of the n-well 3 is greatest at these locations and that field enhancement (so-called peak effect) occurs at location 4.

In accordance with the invention, it is now suggested to reduce the concentration of ions in the critical area of the pn-junction in that, on implantation for the formation of the n-well 3, a mask is used which covers a part of the later n-well 3, namely the part in which the edge of the p-well 2 comes to lie. Because the n-well 3 must be contacted ohmically, on implantation of the n-well 3, two n-doped zones are first created whose distance is dimensioned so that, on subsequent diffusions, the two separate zones combine into one single well. In this way, the concentration of ions of the n-well 3 can be considerably reduced in the area of the lateral edge of the p-well 2 and the breakdown voltage of the pn-junction is therefore increased.

The invention also enables the production of MOS transistors with improved characteristics.

In the following, embodiments of the invention are described in detail based on the drawing.

BRIEF DESCRIPTION OF THE DRAWINGS

FIG. 2b shows a plan view of the mask of FIG. 2a;

FIG. 4b is a plan view of the mask of FIG. 4a;

DETAILED DESCRIPTION OF THE PREFERRED EMBODIMENTS

Figure 1:
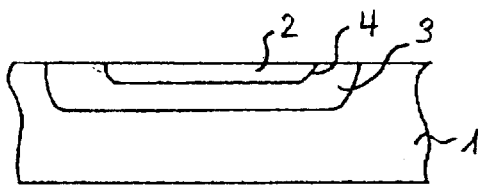
FIG. 1 is a cross section of the pn-junction of a conventional diode.
Figure 2A:
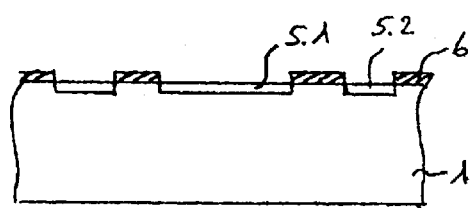
FIG. 2a is a cross section of a substrate of a first conductivity and of mask for implanting two separate zones of a second conductivity.

FIG. 2A shows the cross-section of a substrate 1 of a first conductivity type in the surface of which two separate zones 5.1 and 5.2 are formed by means of implantation of a second conductivity type. On implantation, a mask 6 covers those zones which are not to be doped. If a p-doped substrate 1 is to be used, then the first conductivity type is p-conducting and the second conductivity type n-conducting. If an n-doped substrate 1 is to be used, then the first conductivity type is n-conducting and the second conductivity type p-conducting.

Figure 2B:
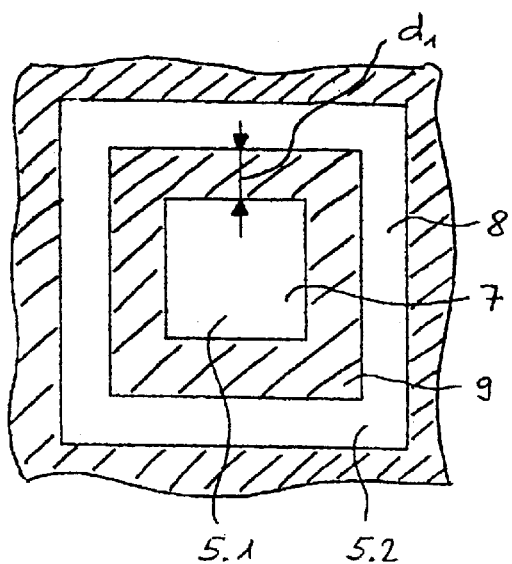
Figure 3:
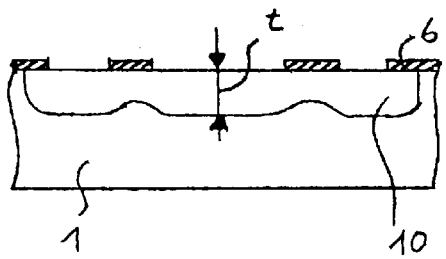
FIG. 3 shows a cross section of the substrate of FIG. 2a wherein the two separate zones are diffused into a single well.

FIG. 2B shows a plan view of the mask 6. The mask 6 has two openings, namely a central window 7 and a strip 8 surrounding it which are separated by a covering strip 9 so that, on implantation, the two separated zones 5.1 and 5.2 of the second conductivity type are created first. The width $d_1$ of the covering strip 9 is dimensioned so that, on the subsequent diffusion process or processes, as a result of the lateral diffusion, the two separated zones 5.1 and 5.2 of the second conductivity type combine into one single well 10 of the second conductivity type. This condition is presented in FIG. 3. Typically, the width $d_1$ of the covering strip 9 of the mask is approximately as large as the depth t of the well 10.

Figure 4A:
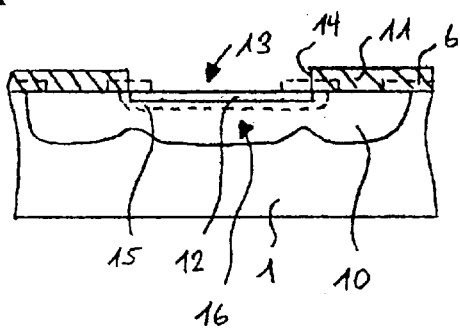

FIG. 4A shows the mask 11 which is used on implantation of a zone 12 of the first conductivity type which lies completely within the well 10. The position of the mask 6, which is used for production of the well 10, is also drawn with a broken line. The mask 11 has a window 13 the edge 14 of which lies almost in the middle of the covering strip 9 of the mask 6. The mask 11 therefore completely covers the zone 5.1 defined by means of the mask 6. The zone 12 completely overlaps the zone 5.1 defined by means of the mask 6 and is larger than the zone 5.1. Preferably, however, the zone 12 does not touch the zone 5.2.

Figure 4B:
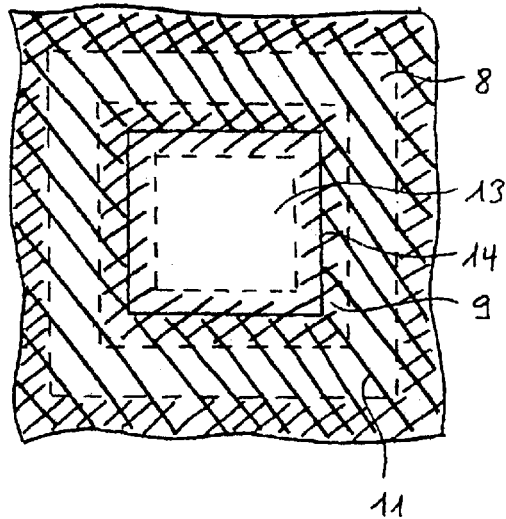

FIG. 4B shows a plan view of the mask 11. The position of the mask 6, which is used for production of the well 10, is again drawn with a broken line. After implantation, a diffusion process takes place which, above all, serves the electrical activation of the implanted ions. The zone 12 now forms a well 15 of the first conductivity type. The two wells 10 and 15 form a pn-junction. In the area of the lateral edge 4, the concentration of ions in the well 10 is now less than with a conventional pn-junction so that a higher breakdown voltage results. With careful alignment of the two masks 6 and 11 which are used for the formation of well 10 or well 15, and the correct selection of the width d, of the covering strip 9 (FIG. 2B) a pn-junction results with which the breakdown now no longer occurs along the lateral edge 4 but in the central, flat area 16 of the pn-junction. A pn-junction produced in this way is suitable for operation as a diode with increased breakdown voltage or for operation as an avalanche photodiode with improved light sensitivity.

The second zone 5.2 also serves the ohmic contact of the well 10, for which reason at least part of the second zone 5.2 is strongly doped with a further implantation process. It is now dependent on the tolerances achieved on the alignment of the masks 6 and 11 whether the second zone 5.2 is to be formed as surrounding strip 8. In any case, the window 13 in the mask 11 is then larger than the zone 5.1 but smaller than the diffused well 10. However, with photosensors, a highly doped surrounding strip 8 offers the advantage of a minimum internal resistance.

Figure 5:
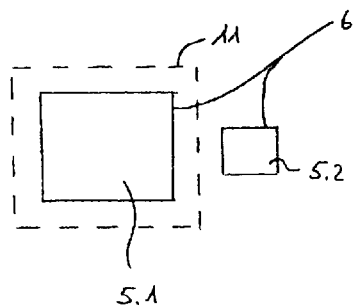
FIG. 5 illustrates the layout of the masks for the production of a further diode in accordance with the invention.

FIG. 5 shows the layout of the mask 6 for production of the well 10 of the second conductivity type and the mask 11 of the well 15 of the first conductivity type for an arrangement where the second zone 5.2 is only large enough so that the electrical contact of the well 10 can take place perfectly.

Figure 6:
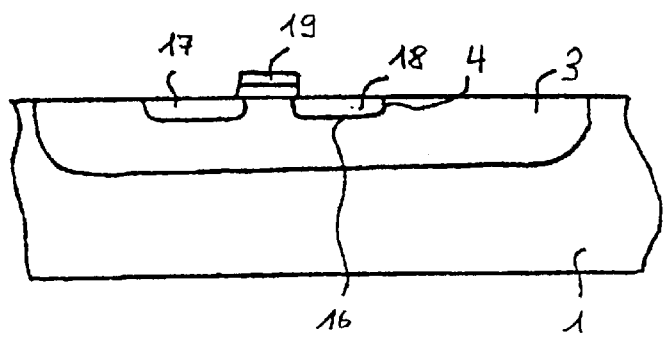
FIG. 6 is a cross section of a p-channel MOS transistor.
Figure 7:
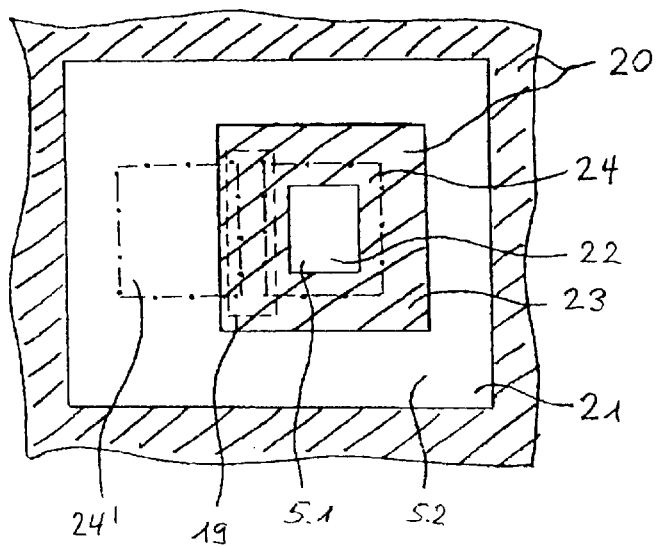
FIG. 7 is a plan view of a mask for use in fabricating the transistor of FIG. 6.

FIG. 6 shows a cross-section of a p-channel MOS transistor which has an n-well 3 diffused in a p-doped substrate 1, two p++ doped zones serving as source 17 and drain 18 and a gate 19. In order to achieve a higher breakdown voltage of the pn-junction between the drain 18 and the n-well 3, a mask 20 is used for the implantation of the n-well with which a part of the square-shaped window customary with prior art was covered. Therefore, the mask 20 for the n-well 3 as presented in FIG. 7 does not contain one single window 21, but two windows 21 and 22 which are separated by a strip-shaped zone 23. During the diffusion processes following the implantation of the n-well, the two n-doped zones 5.1 and 5.2 no longer remain separated but, as a result of the also laterally running diffusion, the two n-doped zones 5.1 and 5.2 combine into the n-well 3 (FIG. 6).

The mask for implantation of the drain 18 has a window 24 presented with a chain-dotted line which is larger than the window 22 so that its edge lies within the strip-shaped zone 23, where the concentration of ions of the n-well 3 is reduced in comparison with the MOS transistors known from prior art. The window 24' of the source is also presented with a chain-dotted line. The breakdown voltage between drain 18 and n-well 3 is, similar to the example of a diode explained above, no longer limited by breakdowns in the area of the lateral edge 4 (FIG. 6) of the drain 18, but by means of breakdowns in the central, flat area 16.

The threshold voltage of the MOS transistor can also be lessened when the gate 19 is arranged completely over the strip-shaped zone 23 as there the doping of the n-well is reduced.

The pn-junctions described can, for example, be used in the known CMOS technology. In this way, highly sensitive photosensors can be realized with the corresponding signal processing circuit on one single semiconductor chip. Additionally, such photosensors can be used with an optical antireflection filter adapted to the spectral range of the flame for flame monitoring or, as CMOS compatible photosensors, can be expanded to a two-dimensional image sensor. For dimensioning examples for the doping of the n-well and p-well for UV photosensors, reference is expressly made to the U.S. Pat. No. 4,910,570, cited above, and herein incorporated by reference.

We claim:

1. Method for making a pn-junction in a semiconductor element to serve as a photosensor, wherein within an area of a first conductivity type, by means of implantation, a first and a second zone of a second conductivity type are formed which are initially separated from each other, with subsequent diffusion processes, as a result of lateral diffusion, the first and the second zone combine into a connected well, by means of implantation, a further zone of the first conductivity type is formed which completely overlaps the first zone of the second conductivity type and which is larger than the first zone, and which does not touch the second zone of the second conductivity type.

2. Flame detector for a burner with a photosensor with a pn-junction produced according to the method of claim 1.

3. MOS transistor with a well which is one of n and p-conducting and a drain having a pn-junction between the drain and the well, said p-n junction being produced according to the method of claim 1.

4. Image sensor with photosensors each of which has a pn-junction produced according to the method in accordance with claim 1.

* * * * *

UNITED STATES PATENT AND TRADEMARK OFFICE
CERTIFICATE OF CORRECTION

PATENT NO.     : 6,376,321 B1
DATED          : April 23, 2002
INVENTOR(S)    : Radivoje Popovic et al.

It is certified that error appears in the above-identified patent and that said Letters Patent is hereby corrected as shown below:

<u>Title page,</u>
Item [73], Assignee, should read -- Siemens Building Technologies AG --

Signed and Sealed this

Twenty-third Day of July, 2002

Attest:

Attesting Officer

JAMES E. ROGAN
*Director of the United States Patent and Trademark Office*